United States Patent [19]

Uehara et al.

[11] 3,942,017

[45] Mar. 2, 1976

[54] APPARATUS FOR IRRADIATION WITH ELECTRON BEAM

[75] Inventors: Kenichiro Uehara; Atsuo Ito; Koichi Nishimune; Kazutoshi Fujita, all of Osaka, Japan

[73] Assignee: Sumitomo Electric Industries, Ltd., Osaka, Japan

[22] Filed: Sept. 9, 1974

[21] Appl. No.: 504,557

[30] Foreign Application Priority Data

| Sept. 11, 1973 | Japan | 48-102470 |
| Sept. 11, 1973 | Japan | 48-102471 |
| Dec. 17, 1973 | Japan | 48-142094 |
| Mar. 30, 1974 | Japan | 49-36028 |

[52] U.S. Cl............................................ 250/492 B
[51] Int. Cl.² .................................... A61K 27/02
[58] Field of Search .......... 250/396, 398, 400, 439, 250/453, 492, 493, 492 B

[56] References Cited
UNITED STATES PATENTS 3,687,716  8/1972  Steigerwald................ 250/398 X

FOREIGN PATENTS OR APPLICATIONS 817,033  7/1959  United Kingdom................ 250/400

*Primary Examiner*—Davis L. Willis
*Attorney, Agent, or Firm*—Carothers and Carothers

[57] ABSTRACT

An irradiation apparatus with high energy electrons is disclosed in which a wire shaped or linear object to be irradiated is moved back and forth many times under an electron window so as to irradiate it with an electron beam. According to one feature of the invention, an electron beam, which leaks through gaps between the objects to be irradiated or which penetrates the objects to be irradiated, is reversed by a magnetic field approximately perpendicular to the scanning face of the electron beam by means of a magnet which is disposed under the objects to be irradiated, and the reversed electron beam is thereby again applied to the objects to be irradiated. A high utilization rate of the electron beam is accomplished, and the objects can be thereby uniformly irradiated with the electron beam.

4 Claims, 6 Drawing Figures

APPARATUS FOR IRRADIATION WITH ELECTRON BEAM

BACKGROUND OF THE INVENTION a. Field of the Invention

This invention relates to an irradiation apparatus with an electron beam, and more particularly to an apparatus to uniformly irradiate wire shaped, string shaped or tape shaped objects with an electron beam so as to increase the utilization rate of the electron beam.

b. Description of the Prior Art

Recently, an irradiation technique utilizing an electron accelerator has vastly been used in various fields such as the preservation of foods, the sterilization of pharmaceuticals, the hardening of coatings, the polymerization of composite materials such as plastics and woods, cross-linking for the purpose of improving the properties of plastics, and the like.

However, it is difficult to irradiate an object having a circular cross-section at the center of which is disposed a copper or aluminium conductor, such as an insulated cable with uniform density of an electron beam and with a high utilization rate of the beam. That is, an electron beam has a low penetration rate compared with gamma rays, X rays or the like. For example, the maximum penetration distance of electrons having the energy of 2 million electron volts (2 MeV) is about 1 cm in water, and their ionization ability becomes maximum at a position which is only slightly spaced from the irradiation surface of the water. The ionization rate of the electrons may be decreased as the depth from the water surface is increased. If the penetration depth indicating the ionization rate of the water surface is used to define an effective electron penetration distance, the effective penetration distance of an electron at 2 MeV is about 0.65 cm in water. The effective penetration distance is 0.073 cm in the case of copper with a specific gravity of 8.9. Therefore, when the insulated cable is irradiated with the electron beam, the greater part of the electron beam may be dissipated at the conductor of the cable, so that the insulating coating layer at the opposite surface of the conductor can not be irradiated with the electron beam. Techniques for eliminating the described disadvantages of the electron beam irradiation are known in U.S. Pat. No. 2,858,442, U.S. Pat. No. 2,887,583, U.S. Pat. No. 2,897,365, French Pat. No. 1,149,703 or the like. In the irradiation technique disclosed in U.S. Pat. No. 2,858,442, a wire shaped object to be irradiated is engaged between two rollers, and a plurality of pairs of rollers are used to try to increase the uniformity of the electron beam irradiation and the utilization rate of the electron beam. Nevertheless, the uniformity of electron beam irradiation has not been actually increased as much as expected. It is supposed that this occurs from the fact that the electron beam runs downward only and the side of the wire opposite to the irradiated side is shadowed by the conductor of the insulated wire to be irradiated. Further, in the irradiation techniques disclosed in U.S. Pat. No. 2,887,583 and U.S. Pat. No. 2,897,365, the path of the electron beam is deflected, using a magnet so as to uniformly irradiate an object therewith. In this case, however, such techniques may have disadvantages in that a complicated configuration of the magnetic poles is required and in that the path of the electron beam in air becomes long. Another technique for irradiating a cable having a comparatively large diameter with the electron beam is disclosed in French Pat. No. 1,149,703.

SUMMARY OF THE INVENTION

The present invention relates to an irradiation apparatus utilizing high energy electrons wherein a wire shaped, string shaped or tape shaped object to be irradiated is moved back and forth many times under an electron window so as to irradiate it with an electron beam. According to one feature of the invention, an electron beam, which penetrates the object or which leaks through gaps between the objects, is deflected by an angle of approximately 180° by means of a magnetic field nearly perpendicular to a scanning face of the electron beam, and the deflected high energy electron beam is again applied to the object to be irradiated. Accordingly, uniform irradiation can be given to a wire shaped, string shaped or tape shaped object to be irradiated, and a high utilization rate of the electron beam can be accomplished.

DESCRIPTION OF THE PREFERRED EMBODIMENTS

The present invention will now be explained by embodiments.

Figure 1:
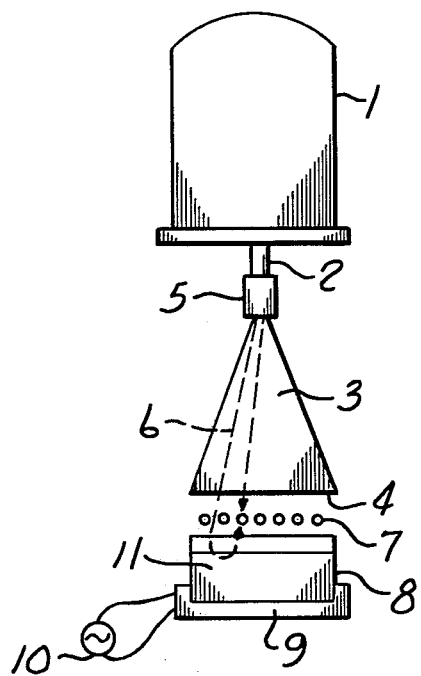
FIG. 1 is a view in front elevation of an electron beam irradiation apparatus according to one embodiment of the invention.

FIG. 1 is an electron beam elevational view of an irradiation apparatus according to one embodiment of the invention, which comprises an electron beam source 1 of an electron accelerator, a tube extension 2 for drifting an electron beam 6, a flared portion 3, an electron window 4 attached to one end of the flared portion 3, an electron beam scanning device 5, objects 7 to be irradiated, a magnet 8 for deflecting electrons, an exciting coil 9 for the magnet 8, and an AC power source 10. An electrostatic accelerator or microwave linear accelerator may be used as the electron accelerator.

Electrons are emitted from a gun of the electron accelerator, and accelerated at the acceleration portion to make high energy electrons. The accelerated electrons are entered to the drift zone of the tube extension 2 in the form of a beam. The electron beam is then scanned by the electron beam scanning device 5, passed through the flared portion 3 and passed out from the electron window 4 to the atmosphere to irradiate the objects 7 therewith. When the object is a string shaped member, a plurality of objects may be generally arranged in parallel and moved under the electron window 4 at a desired rate. When these objects are irradiated with the high energy electron beam, some electrons may pass through the gaps between the wire shaped objects to be irradiated, or some electrons may penetrate the wire shaped objects to be irradiated so that they may be eliminated under the objects. In known irradiation apparatus, an available electron beam may be lost because electrons having passed through the objects are eliminated. On the contrary, according to the present invention, since the magnet 8 for deflecting the electron beam is placed under the objects 7, electrons having passed through the objects 7 will be deflected by an angle of approximately 180° by means of the magnet to produce back-streaming electrons. Therefore, since the objects are irradiated with the back-streaming electrons from the downward direction thereof, uniform irradiation can be accomplished for the objects, and the utilization rate of the electron beam can be increased because electrons which would otherwise be lost are used again.

Figure 2:
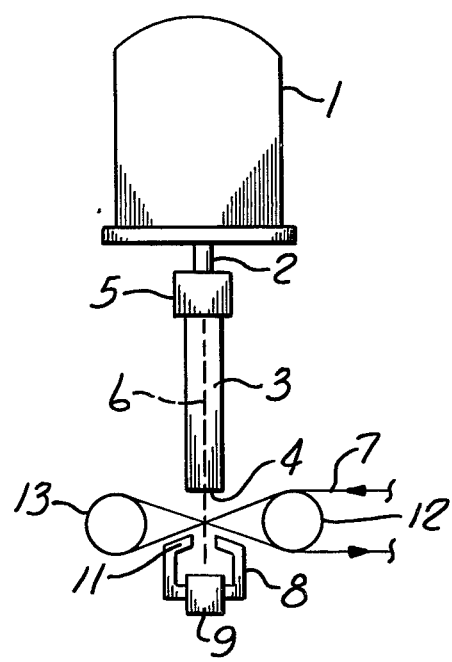
FIG. 2 is a side view of the apparatus shown in FIG. 1.

Although the arrangement of the magnet for deflecting electrons is shown in FIG. 1, a very clear view of the arrangement of the magnet can be obtained from the partial side view of the irradiation apparatus shown in FIG. 2. In the drawing, a drive roller 12 and an inversion roller 13 are provided. In this case, the wire shaped object 7 to be irradiated is engaged with the drive roller 12 and driven therewith. As shown in FIG. 2, the wire shaped object 7 is engaged between the rollers 12 and 13 many times and is passed under the electron window 4 so that the object surface may be reversed. The magnet 8 placed under the electron window is designed in such a manner that two magnetic poles are disposed in parallel with the elongated electron window with a predetermined gap and a desired intensity of magnetic field is applzed to the object so as to inverse thv accelerated electrons having passed th9ougy thv osject by an ]ngle ow approxi4ately 180°. In order to decrease the scattering loss of thv electron beam, thv intensity ow the 4agnetic fzeld must be c6nsidered so that thv path of elvctrons i5 air may bv lowered to bv as short as possible, At the sa4e time, c6nsideration must bv give5 with regard to a5 increase i5 thv gap between thv m]gnetic poles ow thv magnet 8. The intensity ow a magnetit fze3d ow asout 1000 Gauss may be requireu whvn the average radius of curvaturv ow an electron beam of 2 MeV is of the order of 8 cm. In this case, thv distance between the magnetic poles is about 10 cm. Further, it is preferable that the upper faces of the magnetic poles be adapted to be inclined, keeping them aligned with the crossing angle of the wire shaped objects which is crossed in order to approach the objects to be irradiated. According to sucy a technique, the wire shaped objects can be uniformly irradiated with the electron beam from upward, downward and inclined downward directions, and a high utilization rate of the electron beam can be accomplished.

Figure 3:
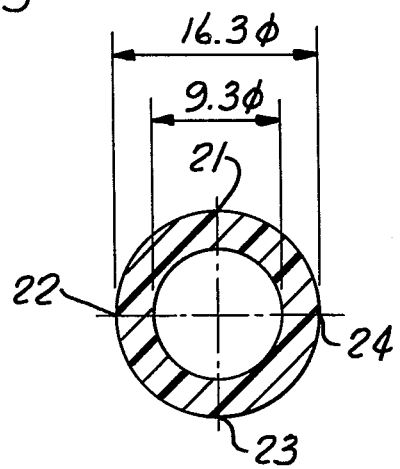
FIG. 3 is a cross-sectional view of a tubular shaped object to be irradiated which is used in the apparatus of FIG. 1.

Table 1 shows measured values of the partial rate of gel fraction in percent measured at points 21, 22, 23 and 24 of a tubular material which are spaced at every 90° angle, when the tubular material as illustrated in FIG. 3 is irradiated with the electron beam by means of the irradiation apparatus having the deflection magnet in accordance with the teachings of this invention and by means of an irradiation apparatus having no deflection magnet.

Table 1

Comparison With Uniformity Of Irradiation
Partial Rate Of Gel Fraction (%)

| NO | without magnet | with magnet |
|---|---|---|
| 21 | 36.6 | 39.3 |
| 22 | 33.7 | 38.8 |
| 23 | 23.3 | 35.5 |
| 24 | 34.2 | 41.7 |
| $\bar{x}$ | 31.9 | 38.6 |
| R | 13.3 | 6.2 |

In Table 1, $x$ represents the average value of the partial rate of gel fraction, and R represents the difference between the maximum value and minimum value thereof, respectively. The measured values given in the table were made with the following applied conditions: $E = 1.8$ MeV, $I_B = 4$ mA, $V = 30$ m/min, $n = 36$, and $B = 1200$ Gauss, where E is the energy of electron current, $I_B$ the electron current, V the travelling rate of the wire shaped object to be irradiated, n the number of reciprocations of the object moving back and forth for several times under the electron window, and B the magnetic flux density of the magnet, respectively.

Figure 4:
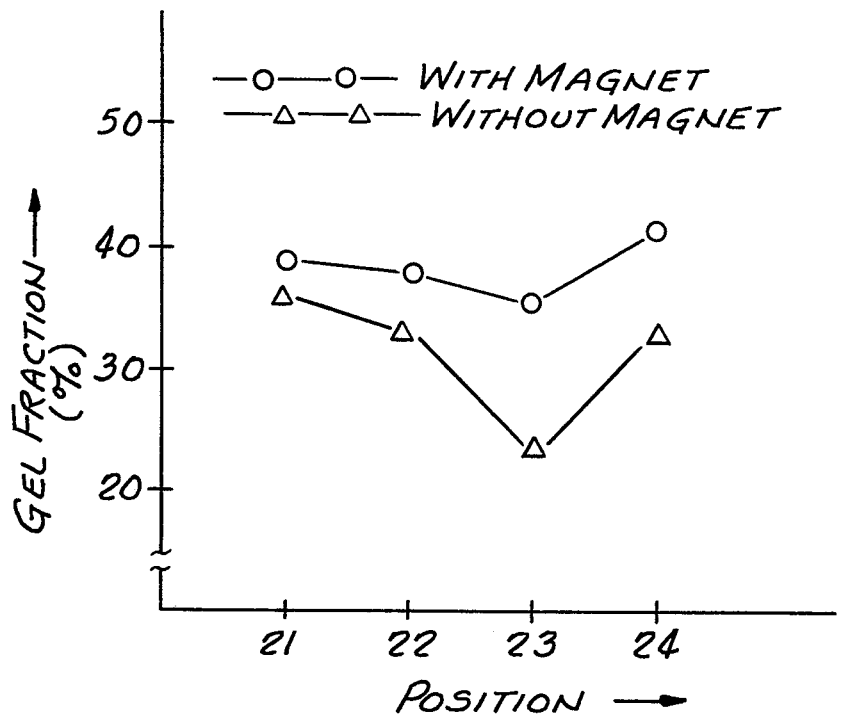
FIG. 4 is a graph showing measured data which indicates a uniform irradiation when the tubular object is irradiated with the electron beam by means of the apparatus of FIG. 1.

If the results of Table 1 are illustrated by a diagram, FIG. 4 will be obtained. It will be apparent from FIG. 4 that the intensity of irradiation is made more uniform over the object by means of the deflection magnet.

In the technique for irradiating both surfaces of the object with the electron beam as disclosed in known U.S. Pat. No. 2,858,442, the electron beam energy is required to be great enough to penetrate half of the maximum thickness X of the insulating coating. In this case half of the maximum thickness X is expressed by $X = W(D - W)$,
where D is the outer diameter of the object to be irradiated, and W is the thickness of the insulating coating of the cable. According to the invention, on the contrary, sufficient irradiation can be performed if the electron beam energy required to penetrate only the thickness of the insulating coating of the insulated cable is provided.

Although a static magnet is used as the magnet for deflecting the electron beam shown in the embodiment of FIG. 1, an electromagnet generating an alternative magnetic field may also be employed. For obtaining the alternative magnetic field, the period and the phase of the AC current flowing through the exciting coil must be determined in relation to a scanning frequency of the electron beam. For example, if the scanning frequency of the electron beam is 100 Hz, the frequency of the alternative magnetic field may be sufficient at 60 Hz or 50 Hz. In addition, when the alternative magnetic field is used, the electron beam may be deflected to various directions according to the cyclical change with time, so that the uniform irradiation can be accomplished.

Figure 5:
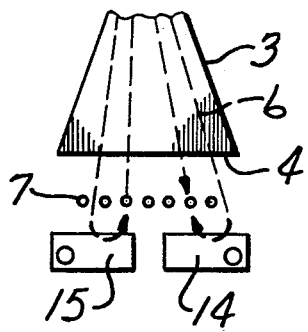
FIG. 5 is a partial front elevational view of an electron beam irradiation apparatus according to another embodiment of the invention.

Another embodiment of the invention is shown in FIG. 5. In the drawing, one part of an electron accelerator of an irradiation apparatus is represented which comprises a tube extension 3, an object 7 to be irradiated with an electron beam 6, and static magnets 14 and 15 for deflecting the electron beam. In this embodiment, the magnet is divided into two magnets each of which has a reversed magnetic field. In the magnetic field shown in FIG. 1, the irradiation efficiency may be decreased in the object disposed at the end portion, because the deflected electron beam is deflected to a direction at which the object is not positioned when the electron beam is passing through the objects. In FIG. 5, on the contrary, since the static magnetic field is applied to the objects in such a manner that the electron beam is deflected to the inside thereof after having passed through the periphery of the objects, the irradiation efficiency at the end object will be improved to thereby increase the preparation rate of the objects to be irradiated.

Figure 6:
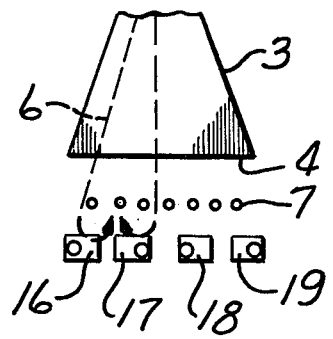
FIG. 6 is a partial front elevational view of an electron beam irradiation apparatus according to still another embodiment of the invention.

Still another embodiment of the invention is shown in FIG. 6. In the drawing, the static magnet for deflecting the electron beam is divided into a plurality of magnets 16, 17, 18 and 19. The paths of the electron beam are illustrated by dashed lines to realize the uniform irradiation pattern.

In the deflection magnets of the irradiation apparatus shown in FIGS. 5 and 6, static magnets are used. However, an alternative magnetic field may also be generated by the respective divided magnets. In this case, the conditions required to give good irradiation must be found, considering the scanning frequency for the electron beam, the alternative period and phase of the magnetic field and the like.

According to the irradiation apparatus of the present invention, uniform irradiation with high efficiency can be given to wire shaped objects such as cables, tubes, etc., or string shaped objects.

What we claim is:

1. An apparatus for irradiating a linear article with high energy electrons which comprises an electron accelerator having means to oscillate an electron beam transversely to the direction of movement thereunder of a linear article to be irradiated, means for simultaneously passing different portions of the linear article under said oscillating beam a plurality of times for irradiation, and means underlying said oscillating beam and the linear object to be irradiated for generating a magnetic field perpendicular to the scanning plane of said oscillating beam, said magnetic field having a strength sufficient to deflect said beam approximately opposite to its direction of incidence.

2. An apparatus for irradiation as claimed in claim 1 wherein said means for generating a magnetic field is a static magnet.

3. An apparatus for irradiation as claimed in claim 1 wherein said means for generating a magnetic field is a magnet excited by alternating current.

4. An apparatus for irradiation as claimed in claim 1 wherein said means for generating a magnetic field comprises at least a pair of static magnets having the same magnetic field strengths with their directions of field reversed with respect to each other.

* * * * *

UNITED STATES PATENT OFFICE
CERTIFICATE OF CORRECTION

PATENT NO. : 3,942,017
DATED : March 2, 1976
INVENTOR(S) : Kenichiro Uehara, Atsuo Ito, Koichi Nishimune and Kazutoshi Fujita It is certified that error appears in the above-identified patent and that said Letters Patent are hereby corrected as shown below:

Col. 2, line 46, delete "electron beam"

line 46, after "an" (last occurrence) insert --electron beam--

Col. 3, lines 37 through 49, erase "field is applzed . . . it is preferable" in entirety and substitute --field is applied to the object so as to inverse the accelerated electrons having passed through the object by an angle of approximately 180°. In order to decrease the scattering loss of the electron beam, the intensity of the magnetic field must be considered so that the path of electrons in air may be lowered to be as short as possible. At the same time, consideration must be given with regard to an increase in the gap between the magnetic poles of the magnet 8. The intensity of a magnetic field of about 1000 Gauss may be required when the average radius of curvature of an electron beam of 2 MeV is of the order of 8 cm. In this case, the distance between the magnetic poles is about 10 cm. Further, it is preferable--

Col. 3, line 54, erase "sucy" and substitute --such--

Col. 4, line 35, erase " W(D - W)," and substitute

-- $\sqrt{W(D - W)}$, --

Signed and Sealed this

Seventh Day of September 1976

[SEAL]

Attest:

RUTH C. MASON
Attesting Officer

C. MARSHALL DANN
Commissioner of Patents and Trademarks